(12) United States Patent
Ikeda et al.

(10) Patent No.: US 10,536,653 B2
(45) Date of Patent: Jan. 14, 2020

(54) SOLID-STATE IMAGING DEVICE AND IMAGING SYSTEM WITH A PLURALITY OF ELECTRODES SEQUENTIALLY BECOMING A LOWEST POTENTIAL RELATIVE TO CHARGES OF THE PLURALITY OF ELECTRODES

(71) Applicant: CANON KABUSHIKI KAISHA, Tokyo (JP)

(72) Inventors: Hajime Ikeda, Yokohama (JP); Takahiro Yamasaki, Tachikawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/288,783

(22) Filed: Feb. 28, 2019

(65) Prior Publication Data
US 2019/0289233 A1    Sep. 19, 2019

(30) Foreign Application Priority Data
Mar. 19, 2018 (JP) ................. 2018-050637

(51) Int. Cl.
*H04N 5/355* (2011.01)
*H01L 27/148* (2006.01)

(52) U.S. Cl.
CPC ........ *H04N 5/3559* (2013.01); *H01L 27/1485* (2013.01)

(58) Field of Classification Search
CPC .... H04N 5/3559; H04N 5/3741; H04N 5/374; H04N 5/351; H04N 5/353; H01L 27/1485
See application file for complete search history.

(56) References Cited

U.S. PATENT DOCUMENTS

| 9,900,539 B2 | 2/2018 | Yamasaki |
| 10,033,953 B2 | 7/2018 | Minowa |
| 2002/0012057 A1* | 1/2002 | Kimura ............... H04N 5/35536 348/308 |
| 2005/0178946 A1* | 8/2005 | Hashimoto ............. G01S 7/493 250/208.1 |

(Continued)

OTHER PUBLICATIONS

U.S. Appl. No. 16/259,451, filed Jan. 28, 2019, by Yusuke Onuki.

(Continued)

*Primary Examiner* — Nicholas G Giles
(74) *Attorney, Agent, or Firm* — Venable LLP

(57) ABSTRACT

A solid-state imaging device includes a photoelectric converter including a photoelectric conversion film, a first electrode arranged on one surface side of the photoelectric conversion film, and a plurality of second electrodes arranged on the other surface side of the photoelectric conversion film, a plurality of charge accumulation portions each connected to corresponding one of the plurality of second electrodes, an output unit that outputs a plurality of signals each corresponding to an amount of charges accumulated in each of the plurality of charge accumulation portions, and a control unit that individually controls a drive voltage applied to each of the plurality of second electrodes. The control unit controls the drive voltage applied to each of the second electrodes such that, in an accumulation period of charges of one frame, each of the second electrodes sequentially becomes the lowest potential relative to the charges of the second electrodes.

16 Claims, 12 Drawing Sheets

(56) References Cited

U.S. PATENT DOCUMENTS

2017/0212221 A1     7/2017   Goden
2018/0277575 A1     9/2018   Ikeda
2018/0374886 A1    12/2018   Iwata
2019/0037161 A1     1/2019   Ikeda

OTHER PUBLICATIONS

Shigeru Ando, et al., "Correlation Image Sensor: Two-Dimensional Matched Detection of Amplitude-Modulated Light", IEEE Transactions on Electron Devices, vol. 50, No. 10, Oct. 2003, pp. 2059-2066.

* cited by examiner

SOLID-STATE IMAGING DEVICE AND IMAGING SYSTEM WITH A PLURALITY OF ELECTRODES SEQUENTIALLY BECOMING A LOWEST POTENTIAL RELATIVE TO CHARGES OF THE PLURALITY OF ELECTRODES

BACKGROUND OF THE INVENTION

Field of the Invention

The present invention relates to a solid-state imaging device and an imaging system.

Description of the Related Art

An image sensor that detects a motion of an object in a field of view is expected as a sensor for automated cruise or a robot. In principle, motion detection can be realized by capturing a plurality of images in a short period and comparing the images to each other. However, comparison between the images requires large scale calculation and takes time for processing. In the application described above, in particular, since it is necessary to take an actual response in a short time after detecting motion, there is a demand for faster motion detection of an object.

Ando et al. (Shigeru Ando and Akira Kimachi, "Correlation Image Sensor: Two-Dimensional Matched Detection of Amplitude-Modulated Light", IEEE Transactions on Electron Devices, Vol. 50, No. 10, October 2003, pp. 2059-2066) proposes a time-correlation image sensor as a solid-state imaging device that can calculate a motion of an object at a high speed with less calculation amount. In the sensor described in Ando et al., a plurality of capacitors for accumulating photo carriers are provided for each pixel, and carriers are distributed and accumulated to these capacitors. A motion vector can be calculated by using a plurality of images obtained by capturing while changing the distribution ratio within time of one frame.

A device described in Ando et al. is configured such that each of the plurality of capacitors are connected to a light receiving unit via a transistor, and the amount of a current flowing into each capacitor is controlled by controlling an electric potential of the gate of the transistor.

However, while the configuration described in Ando et al. can sufficiently operate and distribute electric charges when the object is bright and the number of photo carriers are large enough to flow a current, the component dominated by noise becomes excessively large when the object is dark and the signals are discrete, and charges are unable to be suitably distributed.

SUMMARY OF THE INVENTION

The present invention intends to provide a solid-state imaging device and a method of driving the same in which, even when capturing a dark object, photo carriers generated by a photoelectric converter can be suitably distributed and accumulated in a plurality of charge accumulation portions.

According to one aspect of the present invention, provided is a solid-state imaging device that includes a photoelectric converter including a photoelectric conversion film that generates charges by incidence of light, a first electrode arranged on one surface side of the photoelectric conversion film, and a plurality of second electrodes arranged on the other surface side of the photoelectric conversion film, a plurality of charge accumulation portions each connected to corresponding one of the plurality of second electrodes, an output unit that outputs a plurality of signals each corresponding to an amount of charges accumulated in each of the plurality of charge accumulation portions, and a control unit that individually controls a drive voltage applied to each of the plurality of second electrodes, wherein the control unit controls the drive voltage applied to each of the plurality of second electrodes such that, in an accumulation period of charges of one frame, each of the plurality of second electrodes sequentially becomes the lowest potential relative to the charges of the plurality of second electrodes.

Further, according to another aspect of the present invention, provided is a method of driving a solid-state imaging device including a photoelectric converter including a photoelectric conversion film that generates charges by incidence of light, a first electrode arranged on one surface side of the photoelectric conversion film, and a plurality of second electrodes arranged on the other surface side of the photoelectric conversion film, a plurality of charge accumulation portions each connected to corresponding one of the plurality of second electrodes, and an output unit that outputs a plurality of signals each corresponding to an amount of charges accumulated in each of the plurality of charge accumulation portions, the method including individually controlling a drive voltage applied to each of the plurality of second electrodes such that, in an accumulation period of charges of one frame, each of the plurality of second electrodes sequentially becomes the lowest potential relative to the charges of the plurality of second electrodes.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
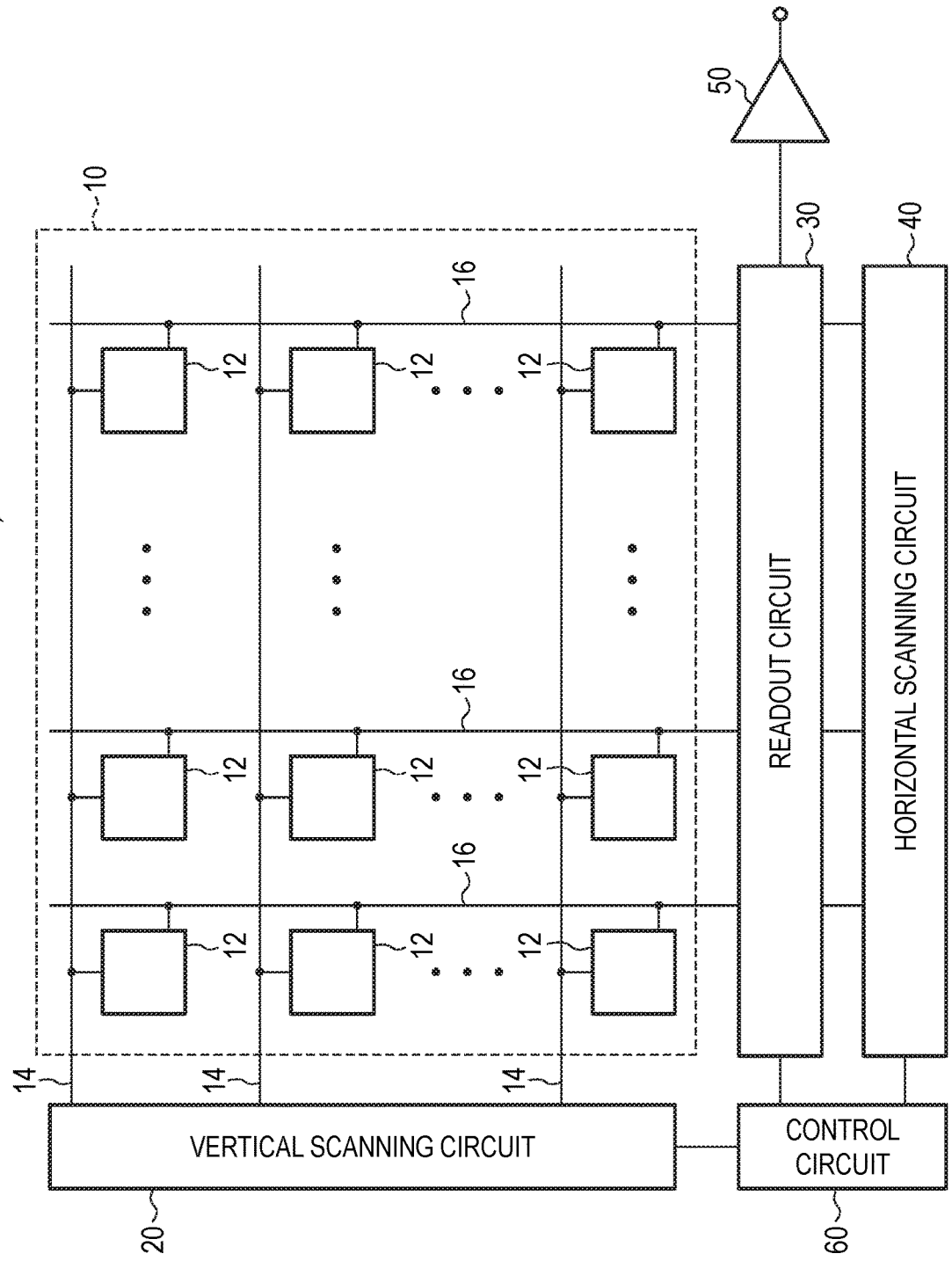
FIG. 1 is a block diagram illustrating a general configuration of a solid-state imaging device according to a first embodiment of the present invention.
Figure 2:
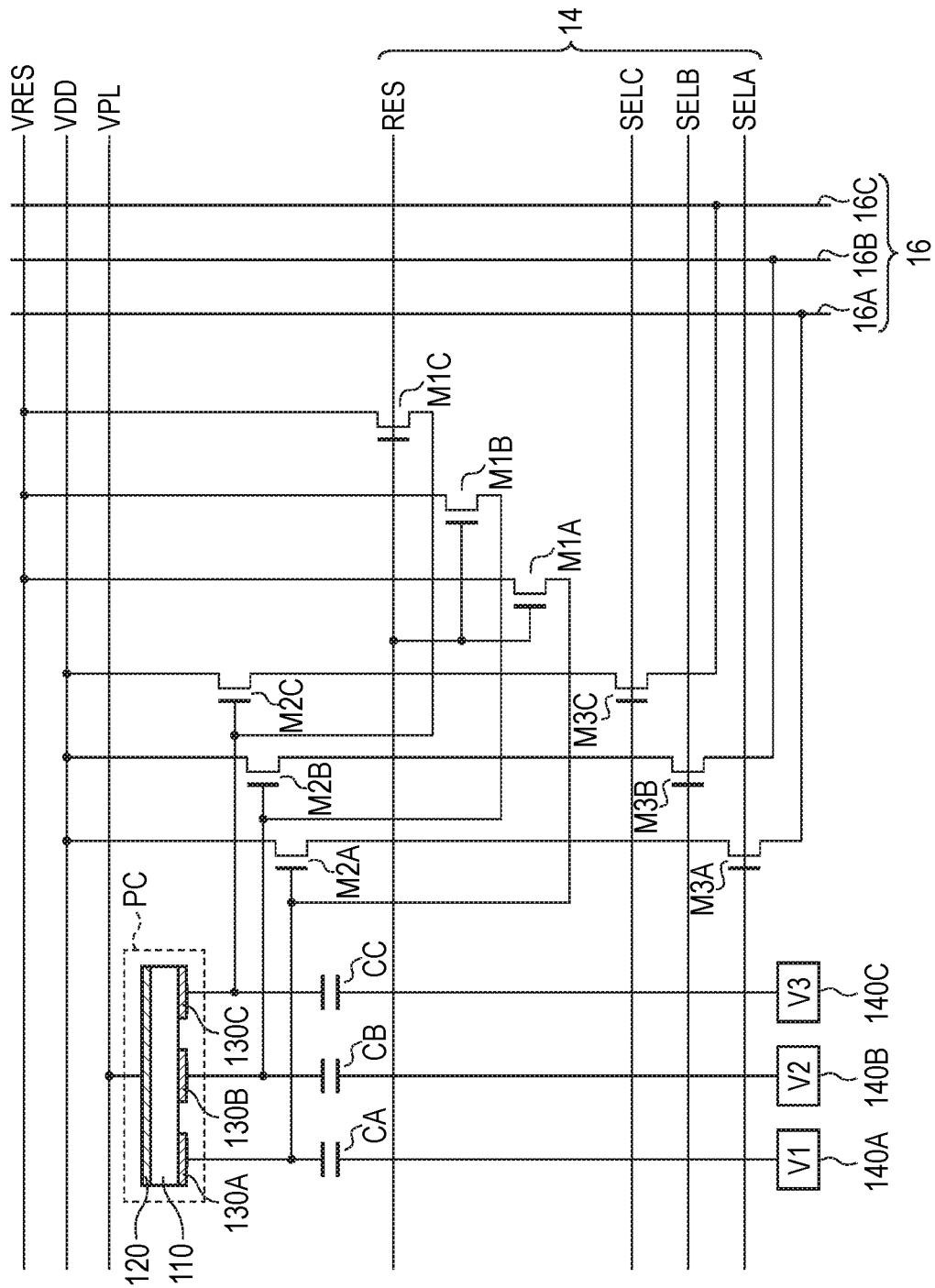
FIG. 2 is a circuit diagram illustrating a configuration example of a pixel of the solid-state imaging device according to the first embodiment of the present invention.
Figure 3A:
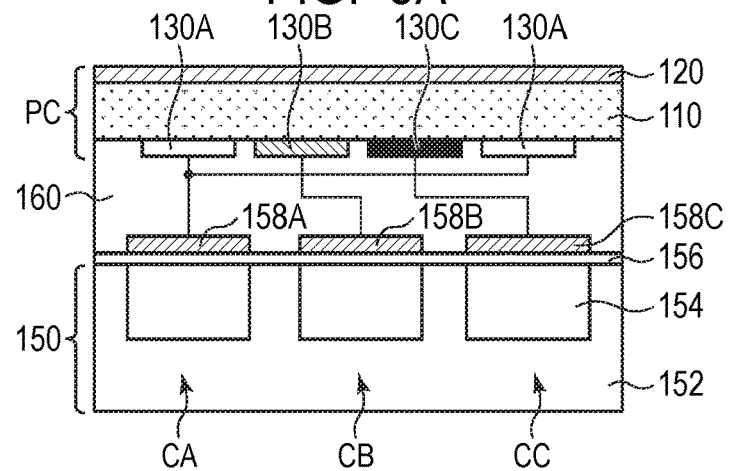
FIG. 3A is a cross-sectional view illustrating the configuration example of the pixel of the solid-state imaging device according to the first embodiment of the present invention.
Figure 3B:
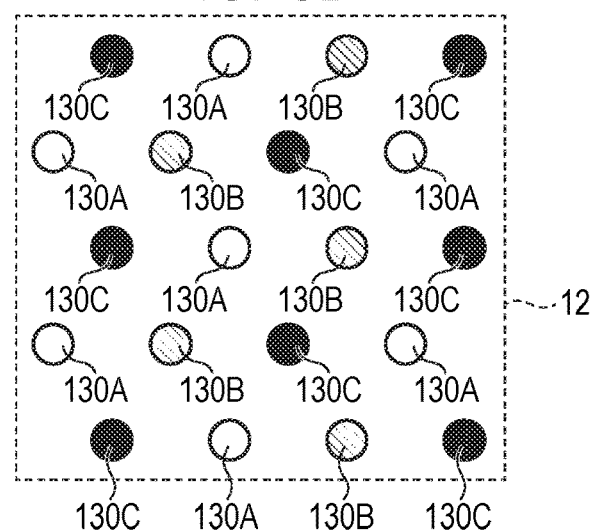
FIG. 3B and FIG. 3C are planar views illustrating the configuration example of the pixel of the solid-state imaging device according to the first embodiment of the present invention.
Figure 3C:
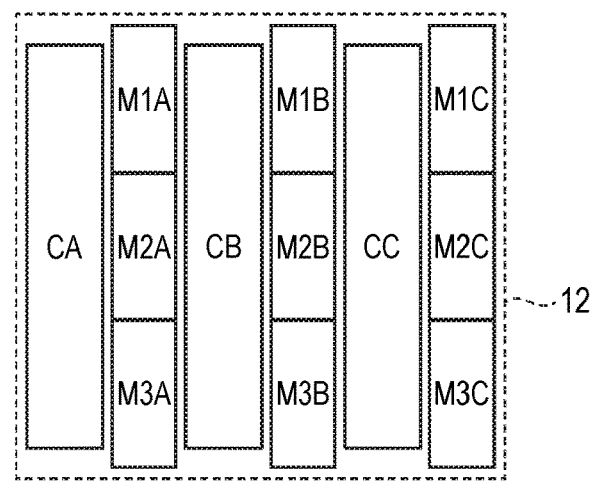
Figure 4:
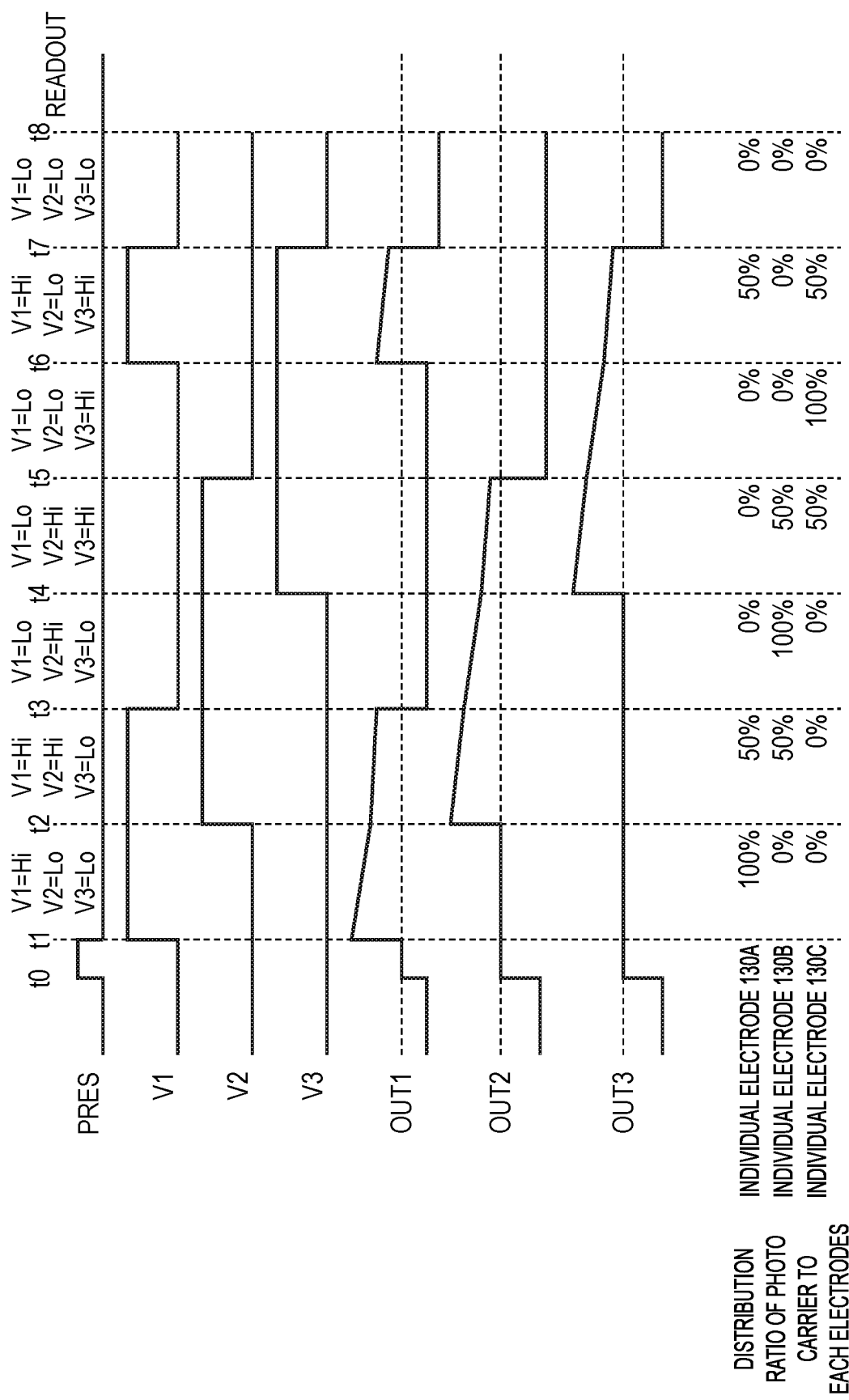
FIG. 4 is a timing chart illustrating a method of driving the solid-state imaging device according to the first embodiment of the present invention.
Figure 5A:
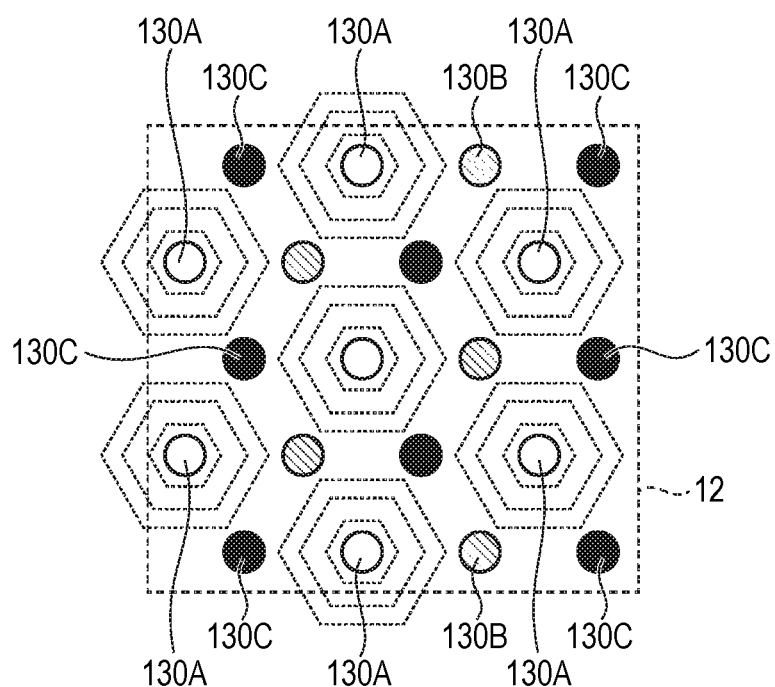
FIG. 5A and FIG. 5B are diagrams illustrating a potential distribution in a photoelectric conversion film during driving of the solid-state imaging device according to the first embodiment of the present invention.
Figure 5B:
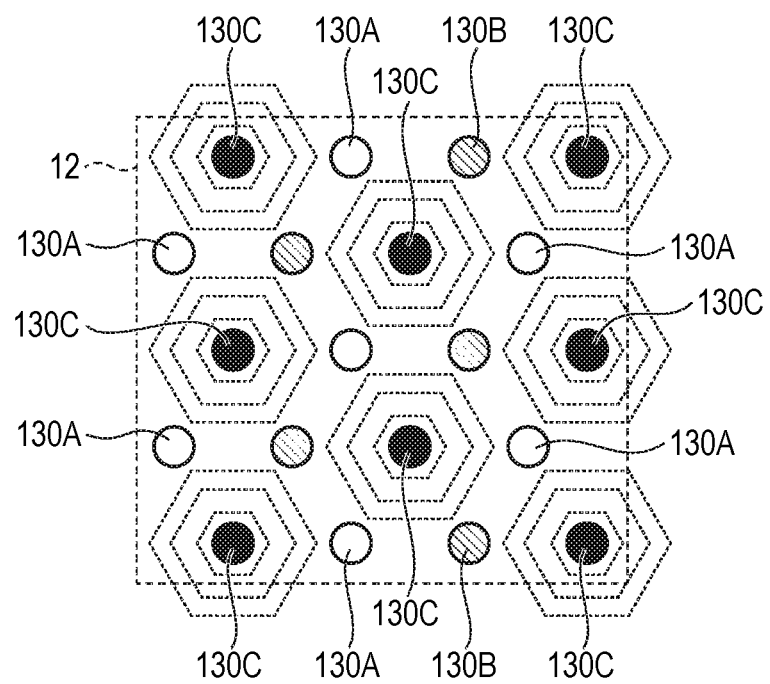
Figure 6A:
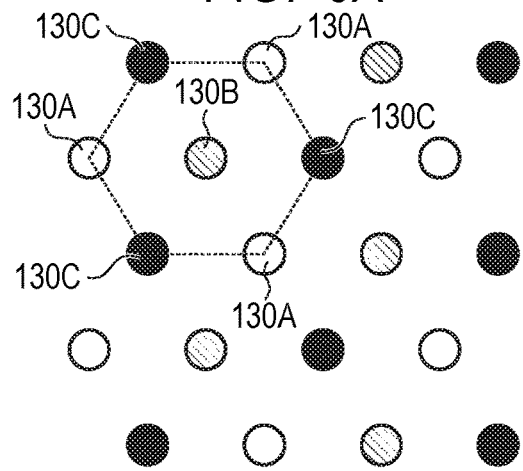
FIGS. 6A, 6B, and 6C are diagrams illustrating a spatial range of the pixel in the solid-state imaging device according to the first embodiment of the present invention.
Figure 6B:
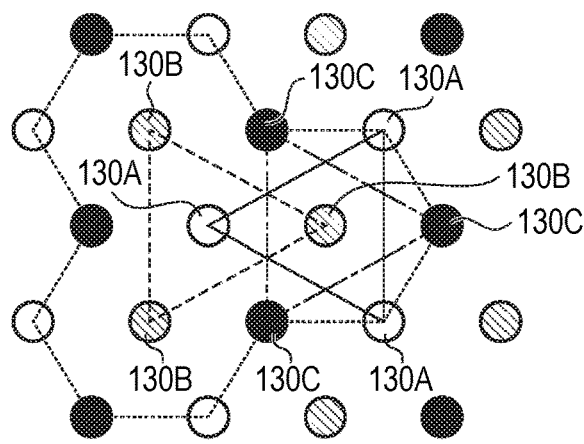
Figure 6C:
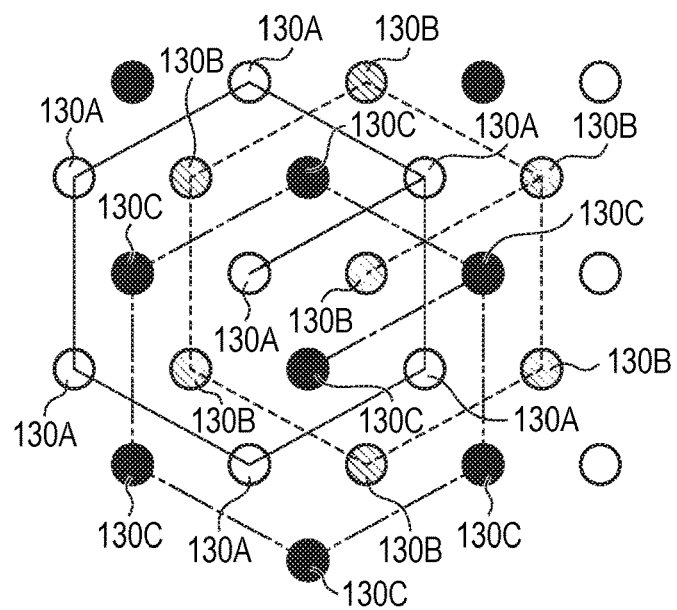

A solid-state imaging device and a method of driving the same according to a first embodiment of the present invention will be described with reference to FIG. 1 to FIG. 6C. FIG. 1 is a block diagram illustrating a general configuration of the solid-state imaging device according to the present embodiment. FIG. 2 is a circuit diagram illustrating a configuration example of a pixel of the solid-state imaging device according to the present embodiment. FIG. 3A is a cross-sectional view illustrating the configuration example of the pixel of the solid-state imaging device according to the present embodiment. FIG. 3B and FIG. 3C are planar views illustrating the configuration example of the pixel of the solid-state imaging device according to the present embodiment. FIG. 4 is a timing chart illustrating a drive method of the solid-state imaging device according to the present embodiment. FIG. 5A and FIG. 5B are diagrams illustrating a potential distribution in a photoelectric conversion film during driving of the solid-state imaging device according to the present embodiment. FIG. 6A to FIG. 6C are diagrams illustrating a spatial range of the pixel in the solid-state imaging device according to the present embodiment.

First, the structure of the solid-state imaging device of the present embodiment will be described by using FIG. 1 to FIG. 3C.

As illustrated in FIG. 1, a solid-state imaging device 100 according to the present embodiment includes a pixel region 10, a vertical scanning circuit 20, a readout circuit 30, a horizontal scanning circuit 40, an output circuit 50, and a control circuit 60.

In the pixel region 10, a plurality of pixels 12 arranged in a matrix over a plurality of rows and a plurality of column are provided. Each of the pixels 12 includes a photoelectric converter that converts an incident light into charges corresponding to a light amount thereof. The number of rows and the number of columns of the pixel arrays arranged in the pixel region 10 are not particularly limited. Further, in addition to the pixels 12 that output a signal corresponding to the light amount of the incident light, other pixels (not illustrated) such as a light-shield optical black pixel, a dummy pixel that does not output a signal, or the like may be arranged in the pixel region 10.

On each row of the pixel arrays in the pixel region 10, a control line 14 is arranged extending in a first direction (the horizontal direction in FIG. 1). Each control line 14 is connected to the pixels 12 aligned in the first direction, respectively, to form a signal line common to these pixels 12. The first direction in which the control line 14 extends may be referred to as a row direction or the horizontal direction. The control line 14 on each row is connected to the vertical scanning circuit 20. Note that the control line 14 on each row may include a plurality of signal lines.

On each column of the pixel arrays of the pixel region 10, an output line 16 is arranged extending in a second direction (the vertical direction in FIG. 1) crossing the first direction. Each output line 16 is connected to the pixels 12 aligned in the second direction, respectively, to form a signal line common to these pixels 12. The second direction in which the output line 16 extends may be referred to as a column direction or the vertical direction. The output line 16 of each column is connected to the readout circuit 30. Note that the output line 16 of each column may include a plurality of signal lines.

The vertical scanning circuit 20 is a control unit that supplies, to the pixel 12 via the control line 14 provided on each row of the pixel array, control signals for driving the readout circuit inside the pixel 12 when the signal is read out from each pixel 12. The vertical scanning circuit 20 may be formed by using a shift register or an address decoder. The signal read out from the pixel 12 is input to the readout circuit 30 via the output line 16 provided for each column of the pixel array.

The readout circuit 30 is a circuit unit that performs a predetermined process such as a signal processing, for example, an amplification process, addition processing, or the like on the signal read out from the pixel 12. The readout circuit 30 may include a signal holding unit, a column amplifier, a correlated double sampling (CDS) circuit, an addition circuit, or the like. The readout circuit 30 may further include an A/D conversion circuit or the like if necessary.

The horizontal scanning circuit 40 is a circuit unit that supplies, to the readout circuit 30, a control signal for sequentially transferring the signal processed in the readout circuit 30 to the output circuit 50 on a column basis. The horizontal scanning circuit 40 may be formed by using a shift resistor or an address decoder. The output circuit 50 is formed of a buffer amplifier, a differential amplifier, or the like and is a circuit unit for amplifying and outputting a column signal selected by the horizontal scanning circuit 40.

The control circuit 60 is a circuit unit used for supplying, to the vertical scanning circuit 20, the readout circuit 30, and the horizontal scanning circuit 40, control signals that control an operation or the timing thereof. Some or all of the control signals supplied to the vertical scanning circuit 20, the readout circuit 30, and the horizontal scanning circuit 40 may be supplied from the external of the solid-state imaging device 100.

Each of the pixels 12 forming the pixel region 10 may be formed of a pixel circuit illustrated in FIG. 2, for example. That is, each of the pixels 12 forming the pixel region 10 includes a photoelectric converter PC, charge accumulation portions CA, CB, and CC, reset transistors M1A, M1B, and M1C, amplifier transistors M2A, M2B, and M2C, and select transistors M3A, M3B, and M3C.

The photoelectric converter PC includes a photoelectric conversion film 110, a common electrode 120 provided on one surface side of the photoelectric conversion film 110, and a plurality of individual electrodes 130A, 130B, and 130C provided on the other surface side of the photoelectric conversion film 110. When the photoelectric converter PC is arranged over a semiconductor substrate, the common electrode 120 is an upper electrode, and the individual electrodes 130A, 130B, and 130C are lower electrodes in an example.

Note that a film configuration of the photoelectric converter PC is not particularly limited and can be appropriately changed if necessary. The photoelectric converter PC may further include a blocking layer arranged between the common electrode 120 and the photoelectric conversion film 110, an insulating layer arranged between the photoelectric conversion film 110 and the individual electrodes 130A, 130B, and 130C, or the like, for example. This blocking layer has a function that prevents inflow of signal carriers from the common electrode 120 side. Further, the insulating layer has a function that prevents a reverse flow of signal carriers from the individual electrodes 130A, 130B, and 130C side to the photoelectric conversion film 110.

The individual electrode 130A of the photoelectric converter PC is connected to one node of the charge accumulation portion CA, the source of the reset transistor M1A, and the gate of the amplifier transistor M2A. The source of the amplifier transistor M2A is connected to the drain of the select transistor M3B. The source of the select transistor M3A is connected to an output line 16A. The other node of the charge accumulation portion CA is connected to a power source 140A that supplies a drive voltage V1.

Similarly, the individual electrode 130B of the photoelectric converter PC is connected to one node of the charge accumulation portion CB, the source of the reset transistor M1B, and the gate of the amplifier transistor M2B. The source of the amplifier transistor M2B is connected to the drain of the select transistor M3B. The source of the select transistor M3B is connected to an output line 16B. The other node of the charge accumulation portion CB is connected to a power source 140B that supplies a drive voltage V2.

Further, the individual electrode 130C of the photoelectric converter PC is connected to one node of the charge accumulation portion CC, the source of the reset transistor M1C, and the gate of the amplifier transistor M2C. The source of the amplifier transistor M2C is connected to the drain of the select transistor M3C. The source of the select transistor M3C is connected to an output line 16C. The other node of the charge accumulation portion CC is connected to a power source 140C that supplies a drive voltage V3.

The drive voltage V1 supplied from the power source 140A, the drive voltage V2 supplied from the power source 140B, and the drive voltage V3 supplied from the power source 140C can be controlled by the control circuit 60 or controlled via the vertical scanning circuit 20.

The drains of the reset transistors M1A, M1B, and M1C are connected to a signal line that supplies a reset voltage (voltage VRES). The drains of the amplifier transistors M2A, M2B, and M2C are connected to a power source line that supplies a power source voltage (VDD). The common electrode 120 of the photoelectric converter PC is connected to a signal line that supplies a voltage VPL.

The gates of the reset transistors M1A, M1B, and M1C are connected to a reset signal line RES. The gate of the select transistor M3A is connected to a select signal line SELA. The gate of the select transistor M3B is connected to a select signal line SELB. The gate of the select transistor M3C is connected to a select signal line SELC. The reset signal line RES and the select signal lines SELA, SELB, and SELC correspond to a single control line 14 illustrated in FIG. 1. Further, the output lines 16A, 16B, and 16C correspond to a single output line 16 illustrated in FIG. 1.

The structure of the pixel 12 will be described more specifically by using FIG. 3A to FIG. 3C. The solid-state imaging device 100 according to the present embodiment is provided to a semiconductor substrate 150 as illustrated in FIG. 3A. Each of the charge accumulation portions CA, CB, and CC of the pixel 12 can be formed of a MIS-type capacitor including an n-type semiconductor region 154 provided within a p-type semiconductor region 152 of the semiconductor substrate 150 and an electrode 158 facing the n-type semiconductor region 154 with an insulating film 156 interposed therebetween. Alternatively, each of the charge accumulation portions CA, CB, and CC may be formed of a MIM-type capacitor in which two metal electrodes such as a flat plate type, a comb teeth type, or the like are combined. The photoelectric converter PC of the pixel 12 is provided, via an interconnection portion 160, over the semiconductor substrate 150 where the charge accumulation portions CA, CB, and CC are provided. The photoelectric converter PC is arranged over the interconnection portion 160 such that a surface on which the individual electrodes 130A, 130B, and 130C are provided faces the semiconductor substrate 150. An interconnection connecting an electrode 158A of the charge accumulation portion CA and the individual electrode 130A, an interconnection connecting an electrode 158B of the charge accumulation portion CB and the individual electrode 130B, an interconnection connecting an electrode 158C of the charge accumulation portion CC and the individual electrode 130C, or the like is arranged in the interconnection portion 160. The interconnection portion 160 is formed of a multilevel interconnection structure in which a plurality of interconnection layers are arranged inside of the insulating film.

FIG. 3B is a planar view illustrating a planar layout of the individual electrodes 130A, 130B, and 130C of a single pixel 12 when the photoelectric converter PC is viewed from the interconnection portion 160 side. Each of the pixels 12 may include a plurality of individual electrodes 130A, 130B, and 130C as illustrated in FIG. 3B. Although a photoelectric converter PC including seven individual electrodes 130A, five individual electrodes 130B, and eight individual electrodes 130C is illustrated in FIG. 3B, the number of each individual electrodes is not particularly limited as long as each of the numbers thereof is one or more. The same type individual electrodes 130 are connected to each other in the interconnection portion 160 and electrically connected to the common electrode 158. Although an example in which three types of individual electrodes 130A, 130B, and 130C are arranged in a hexagonal lattice is illustrated in FIG. 3B, the type or the arrangement of the individual electrodes 130 is not limited thereto.

FIG. 3C is a planar view illustrating a planar layout of each pixel on the semiconductor substrate 150 when the semiconductor substrate 150 is viewed from the interconnection portion 160 side. FIG. 3C schematically illustrates a region where the charge accumulation portions CA, CB, and CC, the reset transistors M1A, M1B, and M1C, the amplifier transistors M2A, M2B, and M2C, and the select transistors M3A, M3B, and M3C are arranged. From the viewpoint of sufficiently maintaining capacitance values of the charge accumulation portions CA, CB, and CC, it is desirable that arrangement regions of the charge accumulation portions CA, CB, and CC occupy a relatively large area.

A light entering the pixel 12 of the solid-state imaging device 100 is absorbed in the photoelectric conversion film 110 of the photoelectric converter PC and generates a photo carrier (electron-hole pair) inside the photoelectric conversion film 110. When the electric potential on the individual electrodes 130A, 130B, and 130C side is set to higher than that on the common electrode 120 side, the electrons generated in the photoelectric conversion film 110 are collected by the individual electrodes 130A, 130B, and 130C and accumulated in the charge accumulation portions CA, CB, and CC. At this time, by appropriately controlling the drive voltages V1, V2, and V3 supplied from the power sources 140A, 140B, and 140C to the charge accumulation portions CA, CB, and CC, the individual electrodes 130A, 130B, and 130C for collecting photo carriers can be optionally selected.

When turned on, the reset transistors M1A, M1B, and M1C reset the charge accumulation portions CA, CB, and CC to a predetermined voltage corresponding to the voltage VRES. The charge accumulation portions CA, CB, and CC maintain the charges transferred from the photoelectric converter PC and form, between both terminals, an electric potential difference corresponding to the amount of the charges transferred from the photoelectric converter PC by charge voltage conversion by the capacitance component thereof. Thereby, a voltage corresponding to the amount of the charges accumulated in the charge accumulation portions CA, CB, and CC is applied to the gates of the amplifier transistors M2A, M2B, and M2C, respectively. The amplifier transistors M2A, M2B, and M2C are configured such that the voltage VDD is supplied to the drain and a bias current is supplied to a source via the select transistors M3A, M3B, and M3C and forms an amplifier unit (source follower circuit) in which the gate is as the input node. Thereby, the amplifier transistors M2A, M2B, and M2C output a signal corresponding to the amount of the charges accumulated in the charge accumulation portions CA, CB, and CC to the output lines 16A, 16B, and 16C via the select transistors M3A, M3B, and M3C, respectively. The amplifier transistors M2A, M2B, and M2C and the select transistors M3A, M3B, and M3C form an output unit that outputs a signal corresponding to the amount of the charges accumulated in the charge accumulation portions CA, CB, and CC.

Next, a method of driving the solid-state imaging device according to the present embodiment will be described by using FIG. 4. FIG. 4 is a timing chart illustrating an operation for one frame. In FIG. 4, a control signal PRES is an electric potential of the reset signal line RES. Signals OUT1, OUT2, and OUT3 are electric potentials of the output lines 16A, 16B, and 16C, respectively. The drive voltages V1, V2, and V3 are output voltages of the power sources 140A, 140B, and 140C, respectively. Note that, when signal charges are electrons, a voltage VPL supplied to the common electrode 120 of the photoelectric converter PC is set so as to be lower than the voltages of the individual electrodes 130A, 130B, and 130C.

First, at time t0, the vertical scanning circuit 20 controls the control signal PRES at a high (Hi) level and turns the reset transistors M1A, M1B, and M1C to an on-state. Thereby, the electric potential of the input node of the amplifier unit is reset to a predetermined electric potential corresponding to the voltage VRES, and the electric potentials of the output lines 16A, 16B, and 16C are set at a reset level. Note that, at the time t0, the drive voltage V1 applied to the other electrode of the charge accumulation portion CA, the drive voltage V2 applied to the other electrode of the charge accumulation portion CB, and the drive voltage V3 applied to the other electrode of the charge accumulation portion CC are at a low (Lo) level.

Next, at time t1, the vertical scanning circuit 20 controls the control signal PRES at the low level and turns the reset transistors M1A, M1B, and M1C to an off-state. Thereby, the reset state of the input node of the amplifier unit is released, and the charge accumulation portions CA, CB, and CC become a state capable of accumulating the electrons generated by the photoelectric converter PC.

Also, at the time t1, the control circuit 60 controls the power source 140A and set the drive voltage V1 at the high level. Thereby, the drive voltage V1 becomes the high level and the drive voltages V2 and V3 become the low level, and therefore the individual electrode 130A is at the lowest potential relative to the photo carriers (electrons). Therefore, the photo carriers (electrons) generated by the photoelectric converter PC are collected via the individual electrode 130A and accumulated in the charge accumulation portion CA. The signal level of the signal OUT1 increases in response to the drive voltage V1 being set at the high level and gradually decreases due to the accumulation of the photo carriers in the charge accumulation portion CA. The time t1 is a start time of an accumulation period of the photo carriers.

Next, at time t2, the control circuit 60 controls the power source 140B and sets the drive voltage V2 at the high level, which is the same as the drive voltage V1. Thereby, the drive voltages V1 and V2 become the high level and the drive voltage V3 becomes the low level, and therefore the photo carriers generated by the photoelectric converter PC are equally collected via the individual electrode 130A and the individual electrode 130B and accumulated in the charge accumulation portion CA and the charge accumulation portion CB, respectively. The signal level of the signal OUT2 increases in response to the drive voltage V2 being set at the high level and gradually decreases due to the accumulation of the photo carriers in the charge accumulation portion CB.

Next, at time t3, the control circuit 60 controls the power source 140A and sets the drive voltage V1 at the low level. Thereby, the drive voltage V2 becomes the high level and the drive voltages V1 and V3 become the low level, and therefore the individual electrode 130B is the lowest potential relative to the photo carriers. Therefore, the photo carriers generated by the photoelectric converter PC are collected via the individual electrode 130B and accumulated in the charge accumulation portion CB. The signal level of the signal OUT1 decreases in response to the drive voltage V1 being controlled from the high level to the low level and becomes lower than the initial reset level by the level corresponding to the amount of the photo carriers accumulated in the charge accumulation portion CA.

Next, at time t4, the control circuit 60 controls the power source 140C and sets the drive voltage V3 at the high level, which is the same as the drive voltage V2. Thereby, the drive voltages V2 and V3 become the high level and the drive voltage V1 becomes the low level, and therefore the photo carriers generated by the photoelectric converter PC are equally collected via the individual electrode 130B and the individual electrode 130C and accumulated in the charge accumulation portion CB and the charge accumulation portion CC, respectively. The signal level of the signal OUT3 increases in response to the drive voltage V3 being set at the high level and gradually decreases due to the accumulation of the photo carriers in the charge accumulation portion CC.

Next, at time t5, the control circuit 60 controls the power source 140B and sets the drive voltage V2 at the low level. Thereby, the drive voltage V3 becomes the high level and the drive voltages V1 and V2 become the low level, and therefore the individual electrode 130C is the lowest potential relative to the photo carriers. Therefore, the photo carriers generated by the photoelectric converter PC are collected via the individual electrode 130C and accumulated in the charge accumulation portion CC. The signal level of the signal OUT2 decreases in response to the drive voltage V2 being controlled from the high level to the low level and becomes lower than the initial reset level by the level corresponding to the amount of the photo carriers accumulated in the charge accumulation portion CB.

Next, at time t6, the control circuit 60 controls the power source 140A and sets the drive voltage V1 at the high level, which is the same as the drive voltage V3. Thereby, the drive voltages V1 and V3 become the high level and the drive voltage V2 becomes the low level, and therefore the photo carriers generated by the photoelectric converter PC are equally collected via the individual electrode 130A and the individual electrode 130C and accumulated in the charge accumulation portion CA and the charge accumulation portion CC, respectively.

Next, at time t7, the control circuit 60 controls the power sources 140A and 140C and sets the drive voltages V1 and V3 at the low level. Thereby, the drive voltages V1, V2, and V3 become the low level, and charges are no longer collected by the individual electrodes 130A, 130B, and 130C. The time t7 is the end time of the photo carrier accumulation period. The signals OUT1, OUT2, and OUT3 at this time point reflect an amount of the charges accumulated in the charge accumulation portions CA, CB, and CC.

Next, at time t8 after setting the drive voltages V1, V2, and V3 at the low level, a signal based on the photo carriers generated during the time t1 to the time t7 can be output by reading out the signals OUT1, OUT2, and OUT3 via the readout circuit 30.

Driving the solid-state imaging device 100 in such a way enables accumulation of the photo carriers generated by the photoelectric converter PC in the three types of the charge accumulation portions CA, CB, and CC. At this time, with an appropriate control of the electric field inside the photoelectric conversion film 110 by the drive voltages V1, V2, and V3, the individual electrodes 130A, 130B, and 130C can be individually controlled to the lowest potential relative to the photo carriers sequentially. Thereby, the photo carriers generated by the photoelectric converter PC can be distributed and accumulated in the three types of the charge accumulation portions CA, CB, and CC while the distribution ratio is changed in the time for one frame.

In the solid-state imaging device according to the present embodiment, since charges generated by the photoelectric converter PC are transferred to the charge accumulation portions CA, CB, and CC without passing through a transistor, this can prevent noise component due to the operation of a transistor or the like from being superimposed on an output signal. Thereby, even when the object is dark and the signals are discrete, the photo carriers generated by the photoelectric converter PC can be suitably distributed and accumulated in the charge accumulation portions CA, CB, and CC.

FIG. 5A and FIG. 5B are schematic diagrams of equipotential (potential energy) lines inside the photoelectric conversion film 110 of a single pixel 12.

FIG. 5A illustrates a state in the period from the time t1 to the time t2 in the timing chart of FIG. 4. In the period from the time t1 to the time t2, the drive voltage V1 is at the high level and the drive voltages V2 and V3 are at the low level, and when viewed from the photo carriers, the potential in the individual electrode 130A portion is the lowest and the potentials in the individual electrodes 130B and 130C portions are high. With such a potential gradient, the photo carriers generated inside the photoelectric conversion film 110 are naturally collected to the electrode 130A portion.

FIG. 5B illustrates a state in the period from the time t2 to the time t3 in the timing chart of FIG. 4. In the period from the time t2 to the time t3, the drive voltages V1 and V2 are at the high level and the drive voltage V3 is at the low level, and when viewed from the photo carriers, the potentials in the individual electrodes 130A and 130B portions are the lowest and the potential in the individual electrode 130C portion is high. With such a potential gradient, the photo carriers generated inside the photoelectric conversion film 110 are evenly collected to the individual electrode 130A portion and the individual electrode 130B portion without being unbalanced on one side. Since being distributed by the electric field at the same time as being generated, the photo carriers can be suitably distributed even when the object is dark.

The spatial range of the pixel 12 varies dynamically in accordance with the connection state between the individual electrodes 130 or the driving scheme thereof. This is because the role of each individual electrodes 130 changes to the role of charge collection and the role of barrier formation during driving.

As illustrated in FIG. 6A, for example, in a case where the individual electrodes 130 are independent from each other, when the individual electrode 130B is focused on, a region surrounded by six individual electrodes 130A and 130C around the individual electrode 130B (region surrounded by the dotted line) is the charge collection range of the individual electrode 130B. This charge collection range can also be referred to as a "pixel" at the moment. Similarly, a charge collection range when the individual electrodes 130A and 130C are at the lowest potential can also be defined. In this case, although the range of the charge collection region varies depending on the type of the individual electrodes 130, the difference therebetween can be ignored when the image of the object is sufficiently larger than the size of the pixel.

Further, FIG. 6B illustrates an example in which a single pixel 12 is formed of nine individual electrodes 130A, 130B, and 130C, in which three individual electrodes 130A are electrically connected to each other, three individual electrodes 130B are electrically connected to each other, and three individual electrodes 130C are electrically connected to each other. When considering the individual electrodes 130A, 130B, and 130C as a single electrode unit, a single pixel 12 can be assumed to be formed of three electrode units. In this case, a region (region surrounded by the dotted line) surrounded by 12 individual electrodes 130A and 130C around the three individual electrodes 130B, which are connected to each other, is the charge collection range of the individual electrode 130B. This charge collection range can also be referred to as a "pixel" at the moment. Similarly, a charge collection range when the individual electrodes 130A and 130C are at the lowest potential can also be defined. In this case, the difference of operations relative to the size of the charge collection range can be relatively reduced.

Further, FIG. 6C illustrates an example in which a single pixel 12 is formed of 21 individual electrodes 130A, 130B, and 130C, in which 7 individual electrodes 130A are electrically connected to each other, 7 individual electrodes 130B are electrically connected to each other, and 7 individual electrodes 130C are electrically connected to each other. When considering the individual electrodes 130A, 130B, and 130C as a single electrode unit, a single pixel 12 can be assumed to be formed of seven electrode units. Although not illustrated here, the difference of operations relative to the size of the charge collection range can be relatively reduced also in this case.

Although a configuration in which the individual electrodes 130A, 130B, and 130C are arranged at equal intervals has been illustrated in the present embodiment, the individual electrodes 130A, 130B, and 130C are not required to be arranged at equal intervals. From the viewpoint that the output via each of the individual electrodes 130A, 130B, and 130C can be equivalently treated, however, the individual electrodes 130A, 130B, and 130C are preferably arranged at equal intervals. The same applies to a case where the number of types of the individual electrodes 130 is four or more.

Further, in the present embodiment, the same type of the individual electrodes 130 are configured not to be adjacent to each other in the closest proximity to each other. This is because, as illustrated in FIG. 5A and FIG. 5B, other individual electrodes are effective in mutually serving as a role of the potential barrier and a role of the charge collection electrode. However, a configuration in which the same type of the individual electrodes 130 are adjacent to each other in the closest proximity to each other can also be employed. For example, each of the individual electrodes 130 can be formed of more than one blocks arranged in proximity.

Further, in the present embodiment, although a plurality of the same type of individual electrodes 130 included in a single pixel 12 are configured to be electrically connected to a single charge accumulation portion C, a plurality of the same type of individual electrodes 130 may be configured to be connected to different charge accumulation portions C, respectively. Further, a switch may be provided between the individual electrodes 130 to enable connection or disconnection to be optionally controlled.

Further, in the present embodiment, although the configuration in which three types of individual electrodes 130A, 130B, and 130C are included in a single pixel 12 is illustrated, the number of types of the individual electrodes 130 is not limited to three. The type of the individual electrodes 130 may be not only three but also two, four, six, or the like.

The arrangement of the individual electrodes 130 can be appropriately selected in accordance with the types of the individual electrodes 130. When the two types or four types of the individual electrodes 130 are provided, for example, a scheme in which two or four individual electrodes 130 are arranged in a square lattice may be employed. When the three types or six types of the individual electrodes 130 are provided, as illustrated in the present embodiment, a scheme in which three or six individual electrodes 130 are arranged in a hexagonal lattice may be employed. These arrangements are preferable from the viewpoint that the same type of the individual electrodes 130 can be arranged at equal intervals.

Further, in the present embodiment, although the drive voltages V1, V2, and V3 are set to two types of a high level and a low level, the setting levels of the drive voltages V1, V2, and V3 are not required to be two types. For example, three types including a high level, a middle level, and a low level, or a plurality of levels including four or more types may be set. Further, the drive voltages V1, V2, and V3 are not necessarily be required to a DC voltage, and an AC voltage may be used.

In such a way, according to the present embodiment, even when an image of a dark object is captured, the photo carriers generated by the photoelectric converter can be suitably distributed to a plurality of outputs.

Second Embodiment

A solid-state imaging device and a method of driving the same according to a second embodiment of the present invention will be described with reference to FIG. 7. The same components as those in the solid-state imaging device according to the first embodiment are labeled with the same references, and the description thereof will be omitted or simplified.

In the first embodiment, the number of levels of the drive voltages V1, V2, and V3 applied to the individual electrodes 130A, 130B, and 130C via the charge accumulation portions CA, CB, and CC is two including a high level and a low level. Depending on a device configuration, however, when the drive voltages V1, V2, and V3 are controlled at the low level, signal charges accumulated in the charge accumulation portions CA, CB, and CC may flow back to the photoelectric conversion film 110. Although the photoelectric converter PC generally employs a film configuration that prevents such a reverse flow of signal charges, the performance that prevents a reverse flow of signal charges is limited. In the present embodiment, a drive method of the solid-state imaging device in which no reverse flow of signal charges to the photoelectric conversion film 110 occurs will be described.

Figure 7:
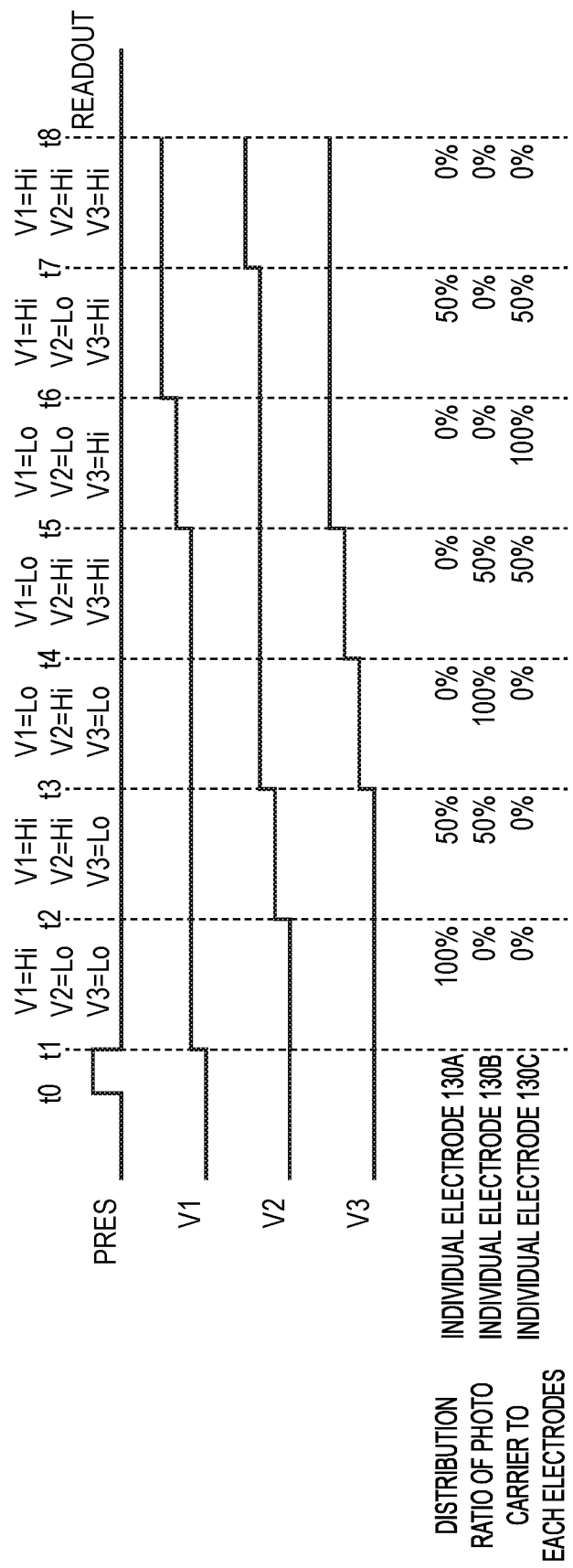
FIG. 7 is a timing chart illustrating a method of driving a solid-state imaging device according to a second embodiment of the present invention.

FIG. 7 is a timing chart illustrating a drive method of a solid-state imaging device according to the present embodiment. FIG. 7 illustrates an operation for one frame. The control signal PRES in FIG. 7 is an electrical potential of the reset signal line RES. The drive voltages V1, V2, and V3 are output voltages of the power sources 140A, 140B, and 140C, respectively. Note that, when signal charges are electrons, a voltage VPL supplied to the common electrode 120 of the photoelectric converter PC is set so as to be lower than the voltages of the individual electrodes 130A, 130B, and 130C.

First, at time t0, the vertical scanning circuit 20 controls the control signal PRES at a high level and turns the reset transistors M1A, M1B, and M1C to an on-state. Thereby, the electric potential of the input node of the amplifier unit is reset to a predetermined electric potential corresponding to the voltage VRES, and the electric potentials of the output lines 16A, 16B, and 16C are set to a reset level. Note that, at the time t0, the drive voltage V1 applied to the other electrode of the charge accumulation portion CA, the drive voltage V2 applied to the other electrode of the charge accumulation portion CB, and the drive voltage V3 applied to the other electrode of the charge accumulation portion CC are at a first level.

Next, at time t1, the vertical scanning circuit 20 controls the control signal PRES at a low level and turns the reset transistors M1A, M1B, and M1C to an off-state. Thereby, the reset state of the input node of the amplifier unit is released, and the charge accumulation portions CA, CB, and CC are turned into a state capable of accumulating the electrons generated by the photoelectric converter PC.

Also, at the time t1, the control circuit 60 controls the power source 140A and sets the drive voltage V1 at a second level, which is higher than the first level. Thereby, the drive voltage V1 becomes the second level and the drive voltages V2 and V3 become the first level, and therefore the photo carriers (electrons) generated by the photoelectric converter PC are collected via the individual electrode 130A and accumulated in the charge accumulation portion CA.

Next, at time t2, the control circuit 60 controls the power source 140B and sets the drive voltage V2 at the second level, which is the same as the drive voltage V1. Thereby, the drive voltages V1 and V2 become the second level and the drive voltage V3 becomes the first level, and therefore the photo carriers generated by the photoelectric converter PC are equally collected via the individual electrode 130A and the individual electrode 130B and accumulated in the charge accumulation portion CA and the charge accumulation portion CB, respectively.

Next, at time t3, the control circuit 60 controls the power sources 140B and 140C, sets the drive voltage V2 at a third level, which is higher than the second level, and sets the drive voltage V3 at the second level. Thereby, the drive voltage V2 becomes the third level and the drive voltages V1 and V3 become the second level, and therefore the photo carriers generated by the photoelectric converter PC are collected via the individual electrode 130B and accumulated in the charge accumulation portion CB.

Next, at time t4, the control circuit 60 controls the power source 140C and sets the drive voltage V3 at the third level, which is the same as the drive voltage V2. Thereby, the drive voltages V2 and V3 become the third level and the drive voltage V1 becomes the second level, and therefore the photo carriers generated by the photoelectric converter PC are equally collected via the individual electrode 130B and the individual electrode 130C and accumulated in the charge accumulation portion CB and the charge accumulation portion CC, respectively.

Next, at time t5, the control circuit 60 controls the power sources 140A and 140C, sets the drive voltage V1 at the third level, and sets the drive voltage V3 at a fourth level, which is higher than the third level. Thereby, the drive voltage V3 becomes the fourth level and the drive voltages V1 and V2 become the third level, and therefore the photo carriers generated by the photoelectric converter PC are collected via the individual electrode 130C and accumulated in the charge accumulation portion CC.

Next, at time t6, the control circuit 60 controls the power source 140A and sets the drive voltage V1 at the fourth level, which is the same as the drive voltage V3. Thereby, the drive voltages V1 and V3 become the fourth level and the drive voltage V2 becomes the third level, and therefore the photo carriers generated by the photoelectric converter PC are equally collected via the individual electrode 130A and the individual electrode 130C and accumulated in the charge accumulation portion CA and the charge accumulation portion CC, respectively.

Next, at time t7, the control circuit 60 controls the power source 140B and sets the drive voltage V2 at the fourth level, which is the same as the drive voltages V1 and V3. The signals OUT1, OUT2, and OUT3 at this time point reflect an amount of the charges accumulated in the charge accumulation portions CA, CB, and CC.

Next, at time t8, a signal based on the photo carriers generated during the time t1 to the time t7 can be output by reading out the signals OUT1, OUT2, and OUT3.

In such a way, the drive method of the solid-state imaging device according to the present embodiment increases stepwise the levels of the drive voltages V1, V2, and V3 without decreasing the levels during the charge accumulation period of one frame. In other words, from the viewpoint of the potential relative to the photo carriers, the drive voltages V1, V2, and V3 are controlled such that the potentials relative to the photo carriers of the individual electrodes 130A, 130B, and 130C are reduced stepwise during the charge accumulation period of one frame. Since the levels of the drive voltages V1, V2, and V3 are increased stepwise without being decreased, the signal charges accumulated in the charge accumulation portions CA, CB, and CC do not flow back to the photoelectric conversion film 110.

Therefore, according to the present embodiment, while a reverse flow of the signal charges accumulated in the charge accumulation portions CA, CB, and CC can be prevented, the same advantage as those of the first embodiment can be realized.

Third Embodiment

Figure 8:
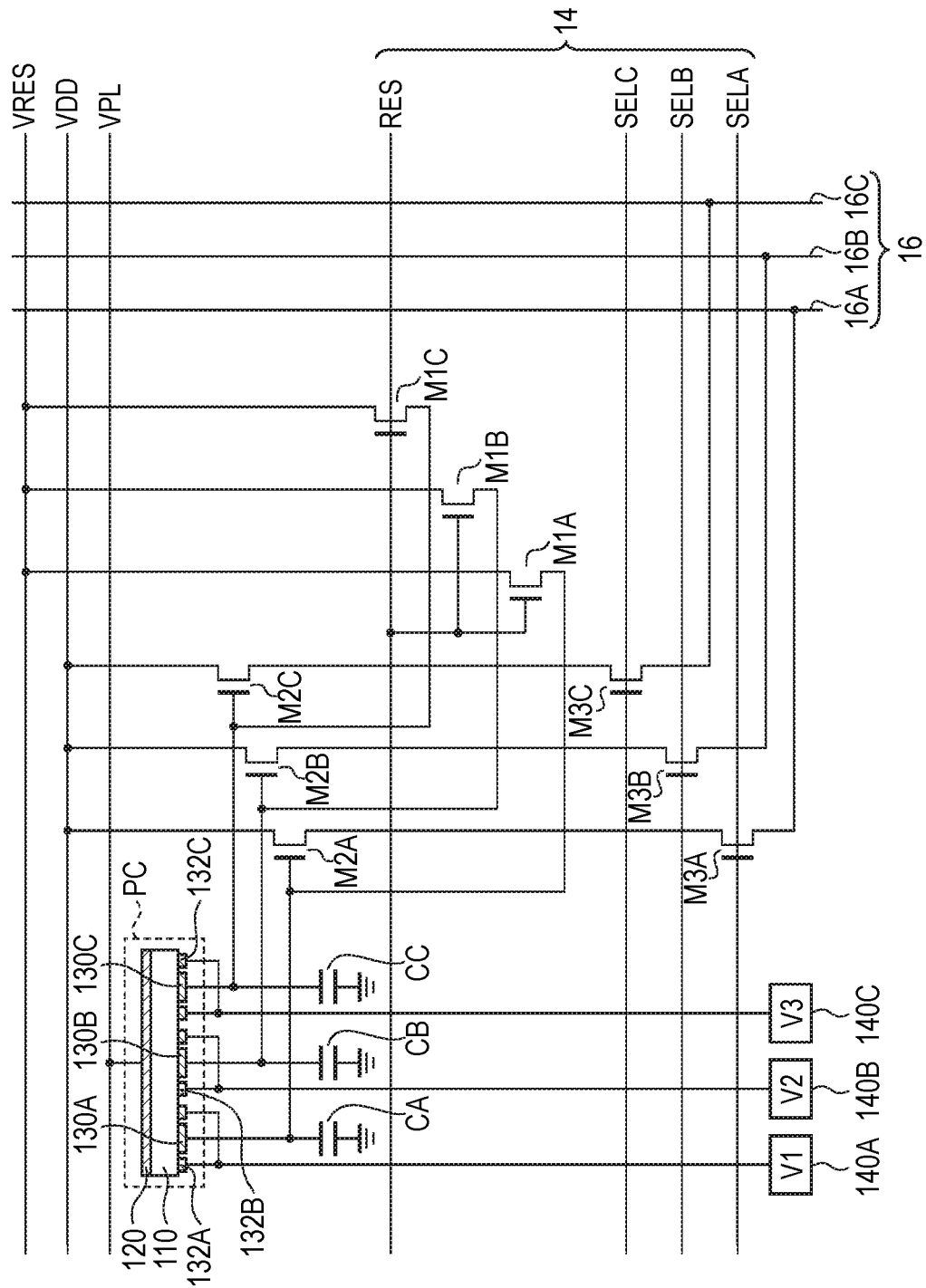
FIG. 8 is a circuit diagram illustrating a configuration example of a pixel of the solid-state imaging device according to a third embodiment of the present invention.
Figure 9:
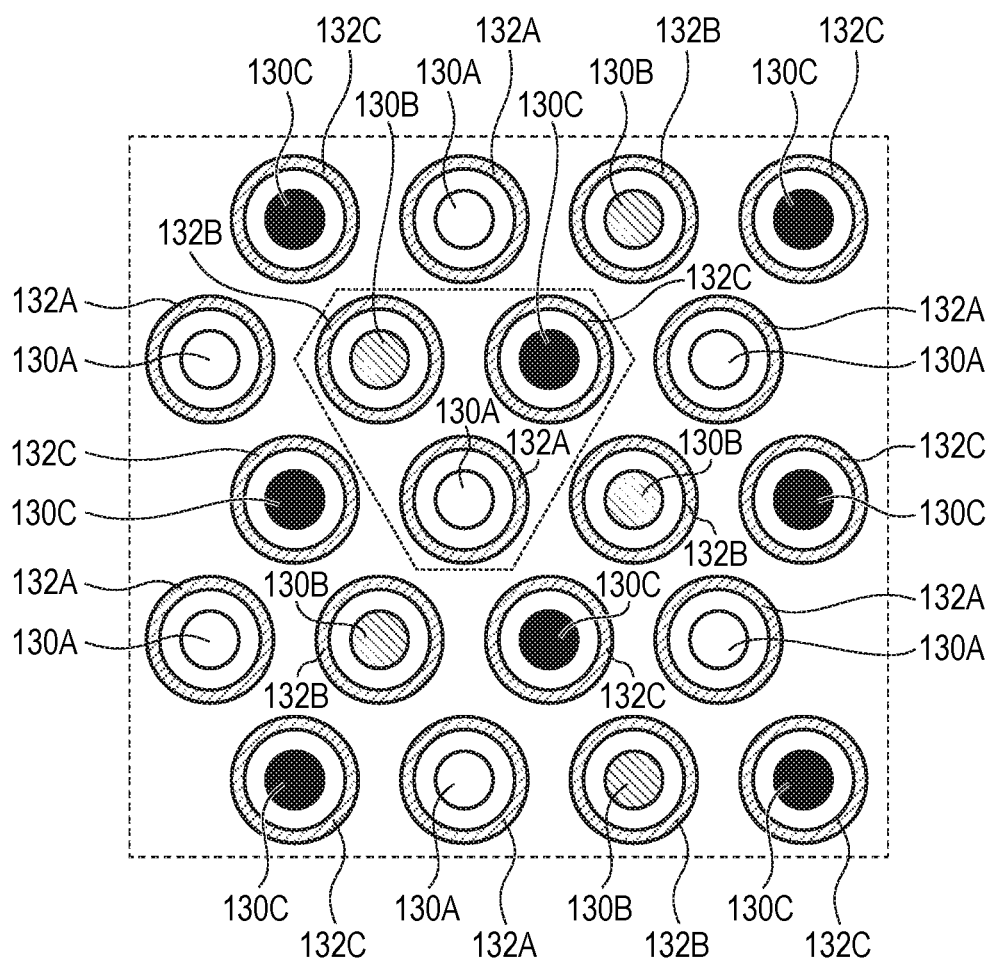
FIG. 9 is a planar view illustrating a configuration example of a pixel of the solid-state imaging device according to the third embodiment of the present invention.
Figure 10:
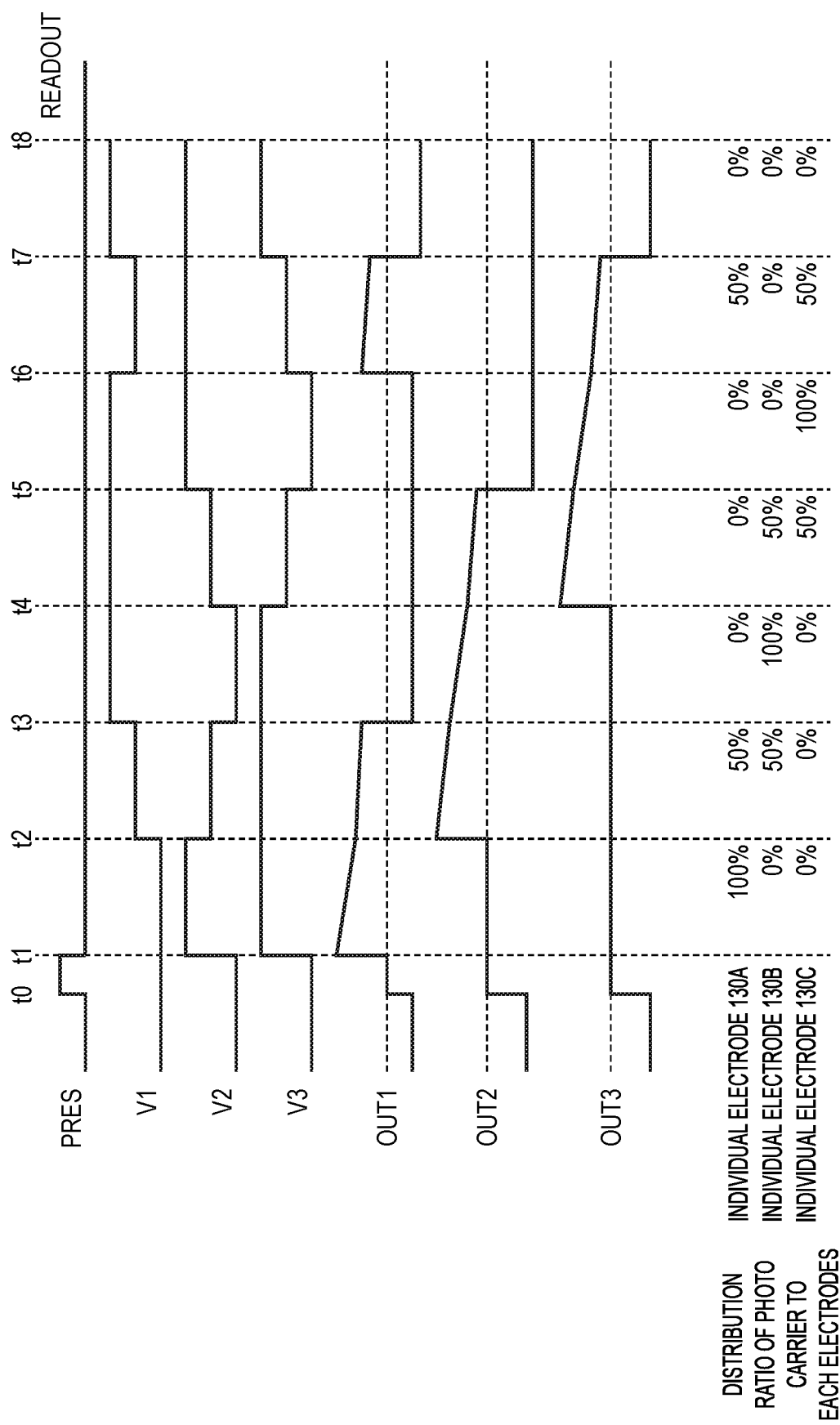
FIG. 10 is a timing chart illustrating a method of driving a solid-state imaging device according to the third embodiment of the present invention.

A solid-state imaging device and a method of driving the same according to a third embodiment of the present invention will be described with reference to FIG. 8 to FIG. 10. The same components as those in the solid-state imaging device according to the first embodiment and the second embodiment are labeled with the same references, and the description thereof will be omitted or simplified. FIG. 8 is a circuit diagram illustrating a configuration example of a pixel of the solid-state imaging device according to the present embodiment. FIG. 9 is a planar view illustrating a configuration example of a pixel of the solid-state imaging device according to the present embodiment. FIG. 10 is a timing chart illustrating a drive method of a solid-state imaging device according to the present embodiment.

Although the individual electrodes 130A, 130B, and 130C are utilized as a drive electrode of the photoelectric converter PC and as an electrode that outputs photo carriers in the solid-state imaging device according to the first embodiment and the second embodiment, another electrode may be responsible for these roles. In the present embodiment, a solid-state imaging device in which separate electrodes are used for the drive electrode of the photoelectric converter PC and the electrode used for outputting the photo carriers will be described.

First, the structure of the solid-state imaging device according to the present embodiment will be described by using FIG. 8 and FIG. 9.

In the solid-state imaging device 100 according to the present embodiment, as illustrated in FIG. 8, the photoelectric converter PC in each pixel 12 further includes charge drain electrodes 132A, 132B, and 132C. The charge drain electrodes 132A, 132B, and 132C are connected to the power sources 140A, 140B, and 140C, respectively. The other nodes of the charge accumulation portions CA, CB, and CC are connected to a reference voltage node. Since the charge accumulation portion CA may be any capacitive element as long as it can accumulate photo carriers as a capacitor, the charge accumulation portion CA is not necessarily be required to be a MIS structure or a MIM structure but may be a parasitic capacitance. The remaining configuration is the same as that of the solid-state imaging device 100 according to the first embodiment. As illustrated in FIG. 9, the charge drain electrodes 132A, 132B, and 132C are arranged so as to surround the individual electrodes 130A, 130B, and 130C, respectively. A region surrounded by the dotted line in FIG. 9 indicates one unit of the pixel region.

Note that, as with the individual electrode 130, the charge drain electrode 132 has a role to collect photo carriers of the photoelectric conversion film 110, and thereby the individual electrode 130 and the charge drain electrode 132 can also be regarded as one electrode unit having the same function. Therefore, in the present specification, the individual electrode 130 and the charge drain electrode 132 may be treated as one electrode (second electrode). In such a case, the individual electrode 130A, 130B, and 130C may be referred to as a charge collect electrode.

Next, a method of driving the solid-state imaging device according to the present embodiment will be described by using FIG. 10. FIG. 10 is a timing chart illustrating an operation for one frame. In FIG. 10, the control signal PRES is an electric potential of the reset signal line RES. The signals OUT1, OUT2, and OUT3 are electric potentials of the output lines 16A, 16B, and 16C, respectively. The drive voltages V1, V2, and V3 are output voltages of the power sources 140A, 140B, and 140C, respectively. Note that, when signal charges are electrons, the voltage VPL supplied to the common electrode 120 of the photoelectric converter PC is set so as to be lower than the voltages of the individual electrodes 130A, 130B, and 130C.

In the present embodiment, it is assumed that the drive voltages V1, V2, and V3 can take three types of levels of a high level, a low level, and a middle (Mid) level between the high level and the low level. The voltage at the high level is a voltage by which most of the photo carriers generated inside the photoelectric conversion film 110 surrounding the individual electrode 130 flow into the charge drain electrode 132. The voltage at the middle level is a voltage by which the ratio of the amount of photo carriers flowing into the individual electrode 130 to the amount of photo carriers flowing into the charge drain electrode 132 becomes 1:1. In addition, it is assumed that the photo carriers generated inside the photoelectric conversion film 110 of a single pixel are spatially even. Since a distribution of the electric field inside the photoelectric conversion film 110 is determined by the relationship between the electric potentials of the charge drain electrode 132 and the electric potential of the individual electrode 130, when the relationship between them is the same, the amount of output photo carriers will be the same in any individual electrode 130.

First, at time t0, the vertical scanning circuit 20 controls the control signal PRES at the high level and turns the reset transistors M1A, M1B, and M1C to an on-state. Thereby, the electric potential of the input node of the amplifier unit is reset to a predetermined electric potential corresponding to the voltage VRES, and the electric potentials of the output lines 16A, 16B, and 16C are set to a reset level. Note that, at the time t0, the drive voltage V1 applied to the other electrode of the charge accumulation portion CA, the drive voltage V2 applied to the other electrode of the charge accumulation portion CB, and the drive voltage V3 applied to the other electrode of the charge accumulation portion CC are at the low level.

Next, at time t1, the vertical scanning circuit 20 controls the control signal PRES at the low level and turns the reset transistors M1A, M1B, and M1C to an off-state. Thereby, the reset state of the input node of the amplifier unit is released, and the charge accumulation portions CA, CB, and CC are turned into a state capable of accumulating the electrons generated by the photoelectric converter PC.

Also, at the time t1, the control circuit 60 controls the power sources 140B and 140C and sets the drive voltages V2 and V3 at the high level. Thereby, the drive voltage V1 becomes the low level, and the drive voltages V2 and V3 become the high level. The photo carriers generated inside the photoelectric conversion film 110 surrounding the individual electrode 130A are collected via the individual electrode 130A and accumulated in the charge accumulation portion CA. On the other hand, the photo carriers generated inside the photoelectric conversion film 110 surrounding the individual electrodes 130B and 130C are drained via the charge drain electrode 132B and 132C. At this time, since the amounts of the photo carriers inside the photoelectric conversion film 110 generated around the individual electrodes 130A, 130B, and 130C are the same, the ratio of the signals output via each of the individual electrodes 130A, 130B, and 130C is 100:0:0.

Next, at time t2, the control circuit 60 controls the power sources 140A and 140B and sets the drive voltages V1 and V2 at the middle level. Thereby, the drive voltages V1 and V2 become the middle level, and the drive voltage V3 becomes the high level. The photo carriers generated inside the photoelectric conversion film 110 surrounding the individual electrode 130A are collected via the individual electrode 130A and accumulated in the charge accumulation portion CA. Further, the photo carriers generated inside the photoelectric conversion film 110 surrounding the individual electrode 130B are collected via the individual electrode 130B and accumulated in the charge accumulation portion CB. On the other hand, the photo carriers generated inside the photoelectric conversion film 110 surrounding the individual electrode 130C are drained via the charge drain electrode 132C. At this time, the ratio of the signals output via each of the individual electrodes 130A, 130B, and 130C is 50:50:0. Note that the individual electrode 130C at this time is the lowest potential relative to the photo carriers.

Next, at time t3, the control circuit 60 controls the power sources 140A and 140B and sets the drive voltage V1 at the high level and the drive voltage V2 at the low level. Thereby, the drive voltages V1 and V3 become the high level, and the drive voltage V2 becomes the low level. The photo carriers generated inside the photoelectric conversion film 110 surrounding the individual electrode 130B are collected via the individual electrode 130B and accumulated in the charge accumulation portion CB. On the other hand, the photo carriers generated inside the photoelectric conversion film 110 surrounding the individual electrodes 130A and 130C are drained via the charge drain electrodes 132A and 132C. At this time, the ratio of signals output via each of the individual electrodes 130A, 130B, and 130C is 0:100:0.

Next, at time t4, the control circuit 60 controls the power sources 140B and 140C and sets the drive voltages V2 and V3 at the middle level. Thereby, the drive voltage V1 becomes the high level, and the drive voltages V2 and V3 become the middle level. The photo carriers generated inside the photoelectric conversion film 110 surrounding the individual electrode 130B are collected via the individual electrode 130B and accumulated in the charge accumulation portion CB. Further, the photo carriers generated inside the photoelectric conversion film 110 surrounding the individual electrode 130C are collected via the individual electrode 130C and accumulated in the charge accumulation portion CC. On the other hand, the photo carriers generated inside the photoelectric conversion film 110 surrounding the individual electrode 130A are drained via the charge drain electrode 132A. At this time, the ratio of signals output via each of the individual electrodes 130A, 130B, and 130C is 0:50:50. Note that, at this time, the individual electrode 130A is the lowest potential relative to the photo carriers.

Next, at time t5, the control circuit 60 controls the power sources 140B and 140C and sets the drive voltage V2 at the high level and the drive voltage V3 at the low level. Thereby, the drive voltages V1 and V2 become the high level and the drive voltage V3 becomes the low level. The photo carriers generated inside the photoelectric conversion film 110 surrounding the individual electrode 130C are collected via the individual electrode 130C and accumulated in the charge accumulation portion CC. On the other hand, the photo carriers generated inside the photoelectric conversion film 110 surrounding the individual electrodes 130A and 130B are drained via the charge drain electrodes 132A and 132B. At this time, the ratio of signals output via each of the individual electrodes 130A, 130B, and 130C is 0:0:100.

Next, at time t6, the control circuit 60 controls the power sources 140A and 140C and sets the drive voltages V1 and V3 at the middle level. Thereby, the drive voltage V2 becomes the high level and the drive voltages V1 and V3 become the middle level. The photo carriers generated inside the photoelectric conversion film 110 surrounding the individual electrode 130A are collected via the individual electrode 130A and accumulated in the charge accumulation portion CA. Further, the photo carriers generated inside the photoelectric conversion film 110 surrounding the individual electrode 130C are collected via the individual electrode 130C and accumulated in the charge accumulation portion CC. On the other hand, the photo carriers generated inside the photoelectric conversion film 110 surrounding the individual electrode 130B are drained via the charge drain electrode 132B. At this time, the ratio of signals output via each of the individual electrodes 130A, 130B, and 130C is 50:0:50. Note that, at this time, the individual electrode 130B is the lowest potential relative to the photo carriers.

Next, at time t7, the control circuit 60 controls the power sources 140A and 140C and sets the drive voltages V1 and V3 at the high level. Thereby, the drive voltages V1, V2, and V3 become the high level, the photo carriers generated inside the photoelectric conversion film 110 are drained via the charge drain electrodes 132A, 132B, and 132C, and charges are no longer collected by the individual electrodes 130A, 130B, and 130C. The time t7 is the end time of the photo carriers accumulation period. The signals OUT1, OUT2, and OUT3 at this time point reflect an amount of the charges accumulated in the charge accumulation portions CA, CB, and CC.

In such a way, since the solid-state imaging device 100 according to the present embodiment does not distribute the total amount of the photo carriers generated in the photoelectric conversion film 110, the absolute amount of the output photo carriers is different but the signal ratio is the same as that of the solid-state imaging device according to the first embodiment. Therefore, also in the solid-state imaging device according to the present embodiment, the same advantage as the solid-state imaging device of the first embodiment can be obtained.

Note that, although the charge drain electrodes 132A, 132B, and 132C are provided in a torus shape surrounding the individual electrodes 130A, 130B, and 130C in the present embodiment, the shapes of the charge drain electrodes 132A, 132B, and 132C are not limited thereto. The charge drain electrodes 132A, 132B, and 132C can have any shape as long as it can at least control the photo carriers flowing into the individual electrodes 130A, 130B, and 130C, and the shape thereof is not particularly limited. Each of the charge drain electrodes 132A, 132B, and 132C may be divided into a plurality of blocks.

Further, in the present embodiment, although the example in which a single pixel 12 includes three types of the individual electrodes 130A, 130B, and 130C has been illustrated, each of the individual electrodes 130A, 130B, and 130C may be divided into a plurality of blocks. In such a case, the plurality of blocks may be electrically connected to each other by the interconnection portion 160 such that the photo carriers output from the plurality of blocks are added and output to the charge accumulation portion.

Although it is assumed that the generated photo carriers are spatially even within the pixel in the present embodiment, it is expected that the generated photo carriers may be uneven. In such a case, an error of the output signal due to variation of amounts of the generated carrier inside the photoelectric conversion film 110 can be reduced by subdividing the individual electrode 130 or the charge drain electrode 132 into a plurality of blocks and arranging the blocks spatially evenly as described above.

Fourth Embodiment

Figure 11:
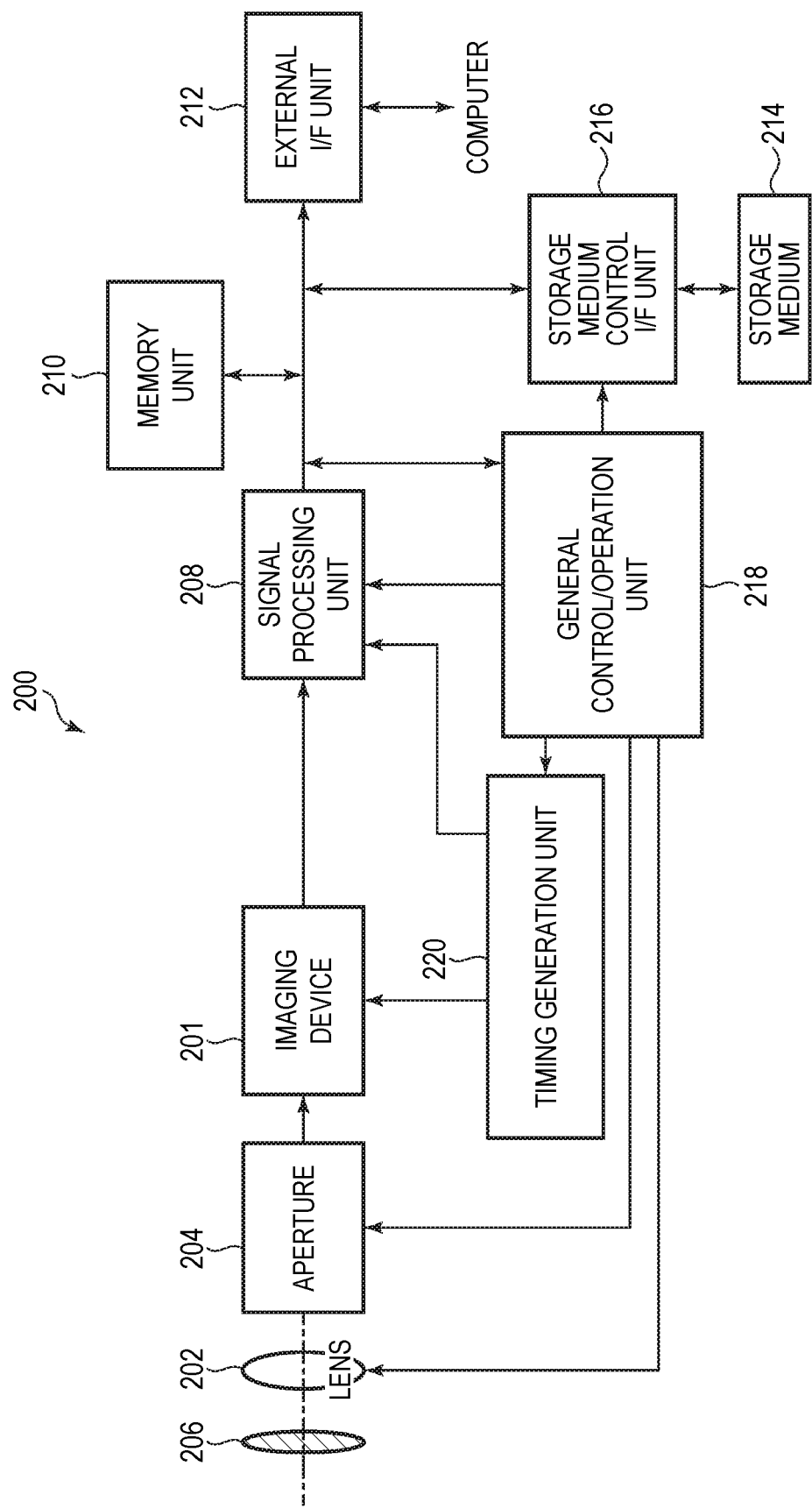
FIG. 11 is a block diagram illustrating a general configuration of an imaging system according to a fourth embodiment of the present invention.

An imaging system according to a fourth embodiment of the present invention will be described with reference to FIG. 11. FIG. 11 is a block diagram illustrating a general configuration of the imaging system according to the present embodiment.

The solid-state imaging device 100 described in the first embodiment to the third embodiment described above can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 11 illustrates a block diagram of a digital still camera as an example out of these examples.

The imaging system 200 illustrated as an example in FIG. 11 includes an imaging device 201, a lens 202 that captures an optical image of an object onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 210 is the solid-state imaging device 100 described in the first embodiment to the third embodiment and converts an optical image captured by the lens 202 into image data.

The imaging system 200 further includes a signal processing unit 208 that processes an output signal output from the imaging device 201. The signal processing unit 208 preforms an AD-conversion that converts an analog signal output by the imaging device 201 into a digital signal. In addition, the signal processing unit 208 performs various correction and compression other than above, if necessary, and outputting image data. An AD-conversion unit, which is a part of the signal processing unit 208, may be formed on a semiconductor substrate on which the imaging device 201 is provided or a semiconductor substrate on which the imaging device 201 is not provided. Further, the imaging device 201 and the signal processing unit 208 may be formed on the same semiconductor substrate.

The imaging system 200 further includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

The imaging system 200 further includes a general control/operation unit 218 that controls various operations and the entire digital still camera and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image.

By applying the solid-state imaging device 100 according to the first embodiment to the third embodiment, it is possible to realize an imaging system that can acquire a better quality image with less noise.

Fifth Embodiment

Figure 12A:
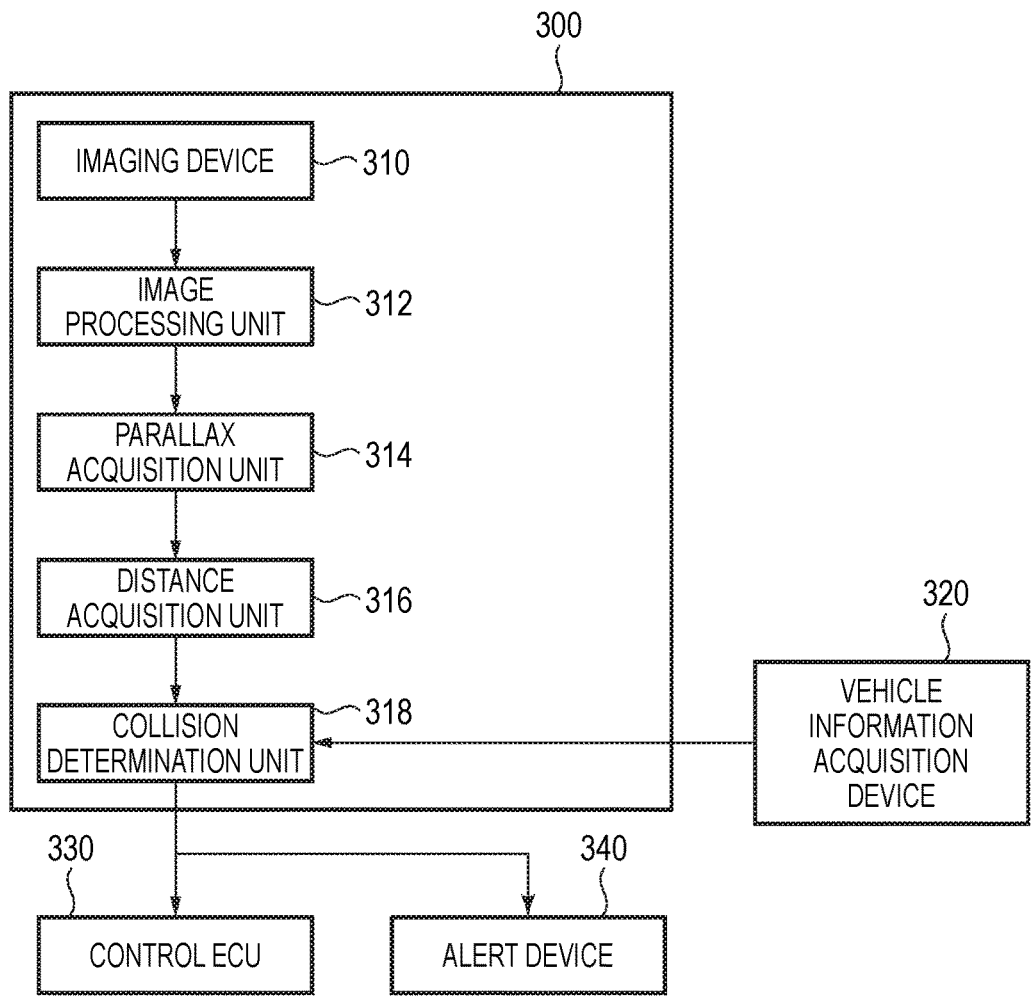
FIG. 12A is a diagram illustrating a configuration example of an imaging system according to a fifth embodiment of the present invention.
Figure 12B:
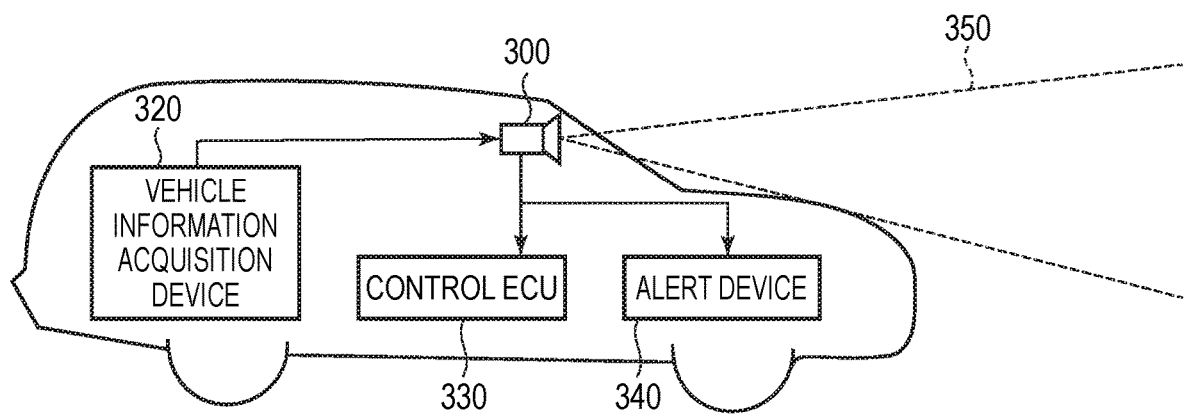
FIG. 12B is a diagram illustrating a configuration example of a movable object according to the fifth embodiment of the present invention.

An imaging system and a movable object according to a fifth embodiment of the present invention will be described with reference to FIG. 12A and FIG. 12B. FIG. 12A is a diagram illustrating a configuration of an imaging system according to the present embodiment. FIG. 12B is a diagram illustrating a configuration of a movable object according to the present embodiment.

FIG. 12A illustrates an example of an imaging system related to an on-vehicle camera. The imaging system 300 includes an imaging device 310. The imaging device 310 is the solid-state imaging device 100 described in any of the first to the third embodiments described above. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 12B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, in the embodiments described above, although an example in which the electrons out of the photo carriers generated in the photoelectric conversion film 110 are collected has been illustrated, holes may be collected. In such a case, the relationship in size between the voltages applied to the common electrode 120 and the individual electrode 130 or a conductivity-types of the P-type semiconductor region 152 and the N-type semiconductor region 154 will be opposite.

Further, the imaging systems illustrated in the fourth and fifth embodiments are examples of an imaging system to which the photoelectric conversion device of the present invention may be applied, and an imaging system to which the photoelectric conversion device of the present invention can be applied is not limited to the configuration illustrated in FIG. 11 and FIG. 12A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-050637, filed Mar. 19, 2018, which is hereby incorporated by reference herein in its entirety.

What is claimed is:
1. A solid-state imaging device comprising:
a photoelectric converter including a photoelectric conversion film that generates charges by incidence of light, a first electrode arranged on one surface side of the photoelectric conversion film, and a plurality of second electrodes arranged on the other surface side of the photoelectric conversion film;
a plurality of charge accumulation portions each connected to corresponding one of the plurality of second electrodes;
an output unit that outputs a plurality of signals each corresponding to an amount of charges accumulated in each of the plurality of charge accumulation portions; and
a control unit that individually controls a drive voltage applied to each of the plurality of second electrodes, wherein the control unit controls the drive voltage applied to each of the plurality of second electrodes such that, in an accumulation period of charges of one frame, each of the plurality of second electrodes sequentially becomes the lowest potential relative to the charges of the plurality of second electrodes.

2. The solid-state imaging device according to claim 1, wherein the control unit switches the drive voltage applied to each of the plurality of second electrodes between a first level and a second level that is different from the first level.

3. The solid-state imaging device according to claim 1, wherein the control unit controls the drive voltage applied to one of the second electrodes such that, in the accumulation period, the potential relative to the charges of the one of the second electrodes of the plurality of second electrodes decreases stepwise.

4. The solid-state imaging device according to claim 1, wherein the control unit controls the drive voltage applied to the second electrodes via the charge accumulation portions.

5. The solid-state imaging device according to claim 4, wherein the control unit switches the drive voltage applied to each of the plurality of second electrodes between a first level and a second level that is different from the first level.

6. The solid-state imaging device according to claim 4, wherein the control unit controls the drive voltage applied to one of second electrodes such that, in the accumulation period, the potential relative to the charges of the one of the second electrodes of the plurality of second electrodes decreases stepwise.

7. The solid-state imaging device according to claim 1,
wherein each of the plurality of second electrodes includes a charge collect electrode and a charge drain electrode,
wherein the charge accumulation portion is connected to the charge collect electrode, and
wherein the control unit controls the drive voltage applied to the charge drain electrode.

8. The solid-state imaging device according to claim 7, wherein the charge drain electrode is provided so as to surround the charge collect electrode.

9. The solid-state imaging device according to claim 1, wherein the plurality of second electrodes include at least three second electrodes, and the three second electrodes are arranged at equal intervals.

10. The solid-state imaging device according to claim 1,
wherein the photoelectric converter includes a plurality of electrode units in which each of the plurality of electrode units includes the plurality of second electrodes, and
wherein, in the plurality of electrode units, corresponding ones of the plurality of second electrodes are electrically connected to each other.

11. The solid-state imaging device according to claim 10, wherein the plurality of electrode units are arranged such that different values of the drive voltage are applied to the closest two second electrodes.

12. The solid-state imaging device according to claim 1, wherein the number of the plurality of second electrodes are three or six, and the three or six second electrodes are arranged in a hexagonal lattice.

13. The solid-state imaging device according to claim 1, wherein the number of the plurality of second electrodes are four, and the four second electrodes are arranged in a square lattice.

14. A method of driving a solid-state imaging device including a photoelectric converter including a photoelectric conversion film that generates charges by incidence of light, a first electrode arranged on one surface side of the photoelectric conversion film, and a plurality of second electrodes arranged on the other surface side of the photoelectric conversion film, a plurality of charge accumulation portions each connected to corresponding one of the plurality of second electrodes, and an output unit that outputs a plurality of signals each corresponding to an amount of charges accumulated in each of the plurality of charge accumulation portions, the method comprising:
individually controlling a drive voltage applied to each of the plurality of second electrodes such that, in an accumulation period of charges of one frame, each of the plurality of second electrodes sequentially becomes the lowest potential relative to the charges of the plurality of second electrodes.

15. An imaging system comprising:
the solid-state imaging device according to claim 1; and
a signal processing unit that processes a signal output from the solid-state imaging device.

16. A movable object comprising:
the solid-state imaging device according to claim 1;
a distance information acquisition unit that acquires distance information on a distance to an object, from parallax images based on a signal from the solid-state imaging device; and
a control unit that controls the movable object based on the distance information.

* * * * *